(12) United States Patent
Beliles, Jr. et al.

(10) Patent No.: US 8,185,618 B2
(45) Date of Patent: May 22, 2012

(54) DYNAMICALLY RESPONDING TO NON-NETWORK EVENTS AT A NETWORK DEVICE IN A COMPUTER NETWORK

(75) Inventors: Robert P. Beliles, Jr., Pleasanton, CA (US); Mark A. Kolar, Highlands Ranch, CO (US)

(73) Assignee: Cisco Technology, Inc., San Jose, CA (US)

( * ) Notice: Subject to any disclaimer, the term of this patent is extended or adjusted under 35 U.S.C. 154(b) by 375 days.

(21) Appl. No.: 11/447,634

(22) Filed: Jun. 6, 2006

(65) Prior Publication Data

US 2007/0283005 A1    Dec. 6, 2007

(51) Int. Cl.
G06F 15/16    (2006.01)
G06F 15/173    (2006.01)

(52) U.S. Cl. ........................................ 709/224; 709/206
(58) Field of Classification Search .................. 709/206, 709/224, 223
See application file for complete search history.

(56) References Cited

U.S. PATENT DOCUMENTS

| | | | |
|---|---|---|---|
| 5,159,685 A | 10/1992 | Kung | |
| 5,388,189 A | 2/1995 | Kung | |
| 5,483,637 A | 1/1996 | Winokur et al. | |
| 5,566,339 A | 10/1996 | Perholtz et al. | |
| 5,581,478 A | 12/1996 | Cruse et al. | |
| 5,777,549 A | 7/1998 | Arrowsmith et al. | |
| 5,955,946 A * | 9/1999 | Beheshti et al. | 340/506 |
| 6,026,500 A | 2/2000 | Topff et al. | |
| 6,067,477 A * | 5/2000 | Wewalaarachchi et al. | 700/83 |
| 6,139,177 A * | 10/2000 | Venkatraman et al. | 700/83 |
| 6,317,639 B1 * | 11/2001 | Hansen | 700/83 |
| 6,356,885 B2 | 3/2002 | Ross et al. | |
| 6,404,629 B1 | 6/2002 | Austin et al. | |
| 6,505,244 B1 | 1/2003 | Natarajan et al. | |
| 6,507,757 B1 | 1/2003 | Swain et al. | |
| 6,539,427 B1 | 3/2003 | Natarajan et al. | |
| 6,549,422 B1 | 4/2003 | Mendoza et al. | |

(Continued)

FOREIGN PATENT DOCUMENTS

EP    1 420 317 A2    5/2004

OTHER PUBLICATIONS

Lindstrom, P., "Let's Get Physical: The Emergence of the Physical Threat," Jun. 2003, 10 pgs., A Spire Research Report, Spire Security, LLC, Malvern, Pennsylvania.

(Continued)

*Primary Examiner* — Kristie Shingles
(74) *Attorney, Agent, or Firm* — Cesari and McKenna, LLP (57) ABSTRACT

A technique dynamically responds to non-network events at a network device in a computer network. According to the novel technique, one or more sensors automatically detect (sense) one or more non-network events, and notifications of the non-network events are then transmitted over the network. One or more network devices (e.g., data centers, servers, routers, etc.) detect the notifications of the network events, and dynamically respond to the non-network events based on one or more associated policies. For example, one or more network-based policies may be defined that modify one or more network configuration parameters in response to the non-network events. Alternatively or in addition, one or more physical-based policies may be defined that instruct one or more network-attached physical control devices to modify one or more physical parameters.

20 Claims, 6 Drawing Sheets

POLICY TABLE 400

| EVENT(S) 405 | ACTION 410 |
|---|---|
| - FIRE | - BACKUP DATA AT HIGH PRIORITY<br>- ACTIVATE FIRE SUPPRESSION |
| - MOTION AND<br>- UNAUTHORIZED NETWORK ACCESS | - LOCK DOORS<br>- PAN VIDEO<br>- RESTRICT USER CONTROLS<br>- SOUND ALARM |
| - ETC. | - ETC. |

ENTRIES (POLICIES) 420

U.S. PATENT DOCUMENTS

| | | | |
|---|---|---|---|
| 6,577,597 B1 | 6/2003 | Natarajan et al. | |
| 6,584,502 B1 | 6/2003 | Natarajan et al. | |
| 6,591,094 B1 * | 7/2003 | Bentley | 455/405 |
| 6,598,033 B2 | 7/2003 | Ross et al. | |
| 6,604,093 B1 | 8/2003 | Etzion et al. | |
| 6,714,977 B1 | 3/2004 | Fowler et al. | |
| 6,751,662 B1 | 6/2004 | Natarajan et al. | |
| 6,754,335 B1 | 6/2004 | Shaffer et al. | |
| 6,765,864 B1 | 7/2004 | Natarajan et al. | |
| 6,769,024 B1 | 7/2004 | Natarajan et al. | |
| 6,775,657 B1 | 8/2004 | Baker | |
| 6,782,422 B1 * | 8/2004 | Bahl et al. | 709/224 |
| 6,831,842 B1 | 12/2004 | Mendoza et al. | |
| 6,907,455 B1 | 6/2005 | Wolfe et al. | |
| 6,930,596 B2 | 8/2005 | Kulesz et al. | |
| 6,970,183 B1 * | 11/2005 | Monroe | 348/143 |
| 6,973,034 B1 | 12/2005 | Natarajan et al. | |
| 6,978,302 B1 | 12/2005 | Chisholm et al. | |
| 7,127,460 B2 * | 10/2006 | Nixon et al. | 707/8 |
| 7,159,022 B2 * | 1/2007 | Primm et al. | 709/224 |
| 7,209,955 B1 * | 4/2007 | Major et al. | 709/207 |
| 7,250,856 B2 * | 7/2007 | Havekost et al. | 340/517 |
| 7,251,534 B2 * | 7/2007 | Walls et al. | 700/17 |
| 7,266,601 B2 * | 9/2007 | Maekawa et al. | 709/224 |
| 7,272,660 B1 * | 9/2007 | Powers et al. | 709/238 |
| 7,272,815 B1 * | 9/2007 | Eldridge et al. | 717/101 |
| 7,283,045 B1 * | 10/2007 | Manz | 340/506 |
| 7,289,995 B2 * | 10/2007 | Motoyama et al. | 707/10 |
| 7,302,481 B1 | 11/2007 | Wilson | |
| 7,307,954 B1 * | 12/2007 | Strandberg et al. | 370/235 |
| 7,310,509 B2 * | 12/2007 | Bristow et al. | 455/405 |
| 7,321,934 B2 * | 1/2008 | Hirose | 709/229 |
| 7,489,921 B2 * | 2/2009 | Bristow et al. | 455/412.2 |
| 7,558,206 B2 * | 7/2009 | Berkman et al. | 370/236 |
| 7,564,871 B2 * | 7/2009 | Liu | 370/468 |
| 7,613,722 B2 * | 11/2009 | Horvitz et al. | 1/1 |
| 7,626,489 B2 * | 12/2009 | Berkman et al. | 340/310.11 |
| 7,626,986 B1 * | 12/2009 | Tse-Au | 370/392 |
| 7,669,051 B2 * | 2/2010 | Redlich et al. | 713/166 |
| 7,756,118 B2 * | 7/2010 | Harmon et al. | 370/352 |
| 7,761,079 B2 * | 7/2010 | Mollenkopf et al. | 455/402 |
| 2003/0061615 A1 | 3/2003 | Van Der Meulen | |
| 2005/0091303 A1 * | 4/2005 | Suzuki | 709/200 |
| 2006/0037077 A1 | 2/2006 | Gadde et al. | |
| 2006/0077891 A1 | 4/2006 | Smith et al. | |
| 2006/0078093 A1 | 4/2006 | Karam et al. | |
| 2006/0082220 A1 | 4/2006 | Karam et al. | |
| 2006/0100799 A1 | 5/2006 | Karam | |
| 2006/0117089 A1 | 6/2006 | Karam | |
| 2006/0224741 A1 * | 10/2006 | Jackson | 709/226 |
| 2007/0039192 A1 * | 2/2007 | Benson et al. | 30/296.1 |
| 2007/0283004 A1 | 12/2007 | Buehler | |

OTHER PUBLICATIONS

U.S. Appl. No. 11/138,720, entitled Method and System for Transmitting Data Over a Network Based on External Non-Network Stimulus, filed May 26, 2005 by Robert Bililes, et al.

U.S. Appl. No. 11/260,532, entitled Unified Network and Physical Premises Access Control Server, filed Oct. 26, 2005, by Mark William Farino, et al.

PCT Notification of Transmittal of the International Search Report and the Written Opinion of the International Searching Authority, or the Declaration, International Application No. PCT/US07/13094, International Filing Date: Jun. 4, 2007, Date of Mailing: Mar. 21, 2008, 8 pages.

* cited by examiner

POLICY TABLE 400

| EVENT(S) 405 | ACTION 410 |
|---|---|
| - FIRE | - BACKUP DATA AT HIGH PRIORITY<br>- ACTIVATE FIRE SUPPRESSION |
| - MOTION<br>AND<br>- UNAUTHORIZED NETWORK ACCESS | - LOCK DOORS<br>- PAN VIDEO<br>- RESTRICT USER CONTROLS<br>- SOUND ALARM |
| - ETC. | - ETC. |

ENTRIES (POLICIES) 420

DYNAMICALLY RESPONDING TO NON-NETWORK EVENTS AT A NETWORK DEVICE IN A COMPUTER NETWORK

RELATED APPLICATIONS

The present invention is related to commonly-owned copending U.S. application Ser. No. 11/138,720 entitled METHOD AND SYSTEM FOR TRANSMITTING DATA OVER A NETWORK BASED ON EXTERNAL NON-NETWORK STIMULUS, filed by Beliles et al. on May 26, 2005, the contents of which are incorporated by reference in its entirety.

The present invention is also related to commonly-owned copending U.S. application Ser. No. 11/260,532 entitled UNIFIED NETWORK AND PHYSICAL PREMISES ACCESS CONTROL SERVER, filed by Farino et al. on Oct. 26, 2005, the contents of which are incorporated by reference in its entirety.

BACKGROUND OF THE INVENTION

1. Field of the Invention

The present invention relates to computer networks and more particularly to dynamically responding to non-network events at a network device in a computer network.

2. Background Information

A computer network is a geographically distributed collection of nodes (or "network devices") interconnected by communication links and segments for transporting data between end nodes, such as personal computers and workstations. Many types of networks are available, with the types ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol consists of a set of rules defining how the nodes interact with each other. Computer networks may be further interconnected by an intermediate network node, such as a router, to extend the effective "size" of each network.

Computer networks and the information transmitted over the networks are generally subject to one or more policies based on network events. A policy, as used herein, refers to a set of rules defining one or more actions that are to be taken in response to one or more events. A network event or network-based event is any event that occurs within the infrastructure and/or data flow of the network, e.g., resulting in topology changes, changes in traffic flow, etc. For example, various network events may include, inter alia, traffic congestion, addition/loss of a link/node, updates to routes within the network, Denial of Service (DoS) attacks, etc. These events are typically discovered by the network devices through techniques that will be understood by those skilled in the art, such as, e.g., various routing protocols, traffic monitoring, etc. Conventional responses to network events may include, for example, redirecting traffic routes (e.g., around failures, congestion, etc.), shutting down a port, applying access control lists (ACLs), etc. Policies regarding network-based events, therefore, are conventionally configured to respond to network events with network-based actions.

A "non-network event" or a "physical event" is any event that occurs within the physical realm/environment, i.e., not within the network infrastructure/data flow. For example, various non-network events may include, inter alia, fire, flood, physical user presence, etc. These events may be detected using known physical sensors, such as smoke detectors, motion sensors, video surveillance equipment, etc. These events detected by the sensors are generally sent to a central monitoring/control system, e.g., a proprietary alarm system, security center, etc. Once the monitoring/control system receives notice of a physical event, one or more physical-based policies may be applied depending upon the particular event. For instance, detection of smoke or fire may result in an automated fire alarm sounding within a particular building. Alternatively, a motion sensor may indicate to a security official that a security breach may be occurring, and the security official may manually determine the cause of the alarm, e.g., by physically inspecting the premises. Policies regarding non-network-based events, therefore, are conventionally configured to respond to non-network events with non-network-based actions. Notably, a physical event directly affecting the network (e.g., physical destruction of a server) results in a network-based event (loss of a node), as will be understood by those skilled in the art.

Today, some physical sensors and monitoring/control systems have begun to offer the capability to attach to computer networks for communication purposes. For instance, rather than providing a set of system-specific or proprietary communication lines within a building, many physical sensor systems are connected to the computer network already in place. As such, the sensors (or designated sensor translators) translate the raw data obtained from the physical sensors and create packets or frames of information suitable for transmission over the computer network. These packets/frames may then be transmitted to the monitoring/control system for processing and reaction. The monitoring/control system may then dynamically respond to the physical (non-network) events, or a system administrator may manually respond.

Currently, network devices, i.e., conventional network devices (routers, servers, etc.) other than the attached sensors and monitoring/control systems, are not configured to respond to non-network events. Generally, the network devices are unaware of its physical surroundings. For example, a router may not know that a building is on fire, but will only detect a loss of communication to one or more nodes within that building after the fire has severed connections or destroyed nodes. At this point, if the network device is located within the same burning building, it may be too late to take any necessary actions. For instance, once a fire in the building is detected, a system administrator may instruct a server or data center to start storing its data at a remote (off-site) location, thus "backing up" the data. The manual intervention of administrators/operators to instruct network devices to change their network operations may be unreliable (assuming they are available and/or notice the physical event) and slow. Importantly, if the only access to a network device is to physically be located with the device, the administrators/operators may be put at risk while attempting to change the network operations (e.g., running into a burning building).

Also, network devices are not configured to control physical parameters within the physical environment (i.e., other than internal systems, e.g., disk drives, tape drives, fans, coolers, etc., as will be understood by those skilled in the art).

In the event of a fire, for example, network devices (such as routers, servers, etc.) are unable to take any physical action, such as closing doors, initiating fire suppression, signaling alarms, etc., to protect themselves, other devices, or even people from danger. As it stands, a network administrator must manually control the physical parameters or manually direct one or more network-attached physical control devices (e.g., a sprinkler system attached to the monitoring/control system) to take action.

In particular, time delays may be associated with transmission of a conventional warning message to a control/monitor station, in addition to the control/monitor station reacting, in further addition to the possible transmission of a reaction back to the area initially causing the physical event. These time delays may occasionally be sufficiently lengthy to prevent critical early responsive action within the network, e.g., preventative protection measures.

Further, because the network device is unaware of the non-network events, it is unable to respond in other ways not directed to protection/self-preservation of the network (network operation and/or physical preservation). For example, the network device is unable to transmit warning messages or other useful information to other network devices or people in response to non-network events, e.g., when the devices/people may be in possible danger. Particularly, the time delays associated with transmitting a message from a control/monitor station may be unacceptable for this information, assuming the message could reach the devices/people (such as, for example, where external communications are severed to devices within a building).

There remains a need, therefore, for a system and method to have network devices efficiently and dynamically respond to non-network (physical) events. There also remains a need for network devices to dynamically control physical parameters in response to non-network and/or network-based events.

SUMMARY OF THE INVENTION

The present invention is directed to a technique for dynamically responding to non-network events at a network device in a computer network. According to the novel technique, one or more sensors automatically detect (sense) one or more non-network events, and notifications of the non-network events are then transmitted over the network. One or more network devices (e.g., data centers, servers, routers, etc.) detect the notifications of the network events, and dynamically respond to the non-network events based on one or more associated policies. For example, one or more network-based policies may be defined that modify one or more network configuration parameters in response to the non-network events. Alternatively or in addition, one or more physical-based policies may be defined that instruct one or more network-attached physical control devices to modify one or more physical parameters.

In accordance with one aspect of the present invention, the sensors are any network-attached devices that sense non-network events, e.g., physical events, that may or may not directly or indirectly affect the network. For instance, fires, floods, unauthorized physical access to a server room, etc., may each affect the network in some way. The sensors, or notably network-attached sensor translators, transmit the notification of the non-network event (e.g., as data packets/frames) on the network to one or more destination devices, such as a monitoring system and/or control center. A network device, which may be a destination device or an "interested" intermediate device, may then receive/intercept the notification.

In accordance with another aspect of the present invention, the receiving/intercepting network device applies one or more pre-configured policies to the notification in order to determine what response, if any, is appropriate. The policies may define various responses relating to network parameters or to physical parameters, each of which is under the control of network-attached devices. For instance, a non-network event (e.g., a fire within a building of the network device) may indicate to the particular network device (e.g., a data storage device intercepting the notification destined for a fire monitoring system) that certain network actions should be performed in response (e.g., to protect the network device's operations and/or people in the area). Accordingly, for example, the storage device may begin transferring the data to an off-site storage location, and may do so at a high priority. Also, the network device may notify a network-attached physical control device control one or more physical parameters, for example, to protect the network device itself (as well as people), such as, e.g., initiating a fire suppression system at the network device, possibly prior to a fire being detected at the network device is (i.e., preemptively).

Advantageously, the novel technique dynamically responds to non-network events at a network device in a computer network. By reacting to non-network events at a network device, the novel technique increases responsiveness to the non-network events, which may result in better operation and/or protection of the network, e.g., for the infrastructure as well as data stored in and/or transmitted over the network, and better protection of people near the non-network events. Also, by dynamically responding, the novel technique increases human personnel safety who would otherwise be required to manually respond in the presence of danger, and further alleviates dependency upon human response (e.g., that must be both proper and timely).

BRIEF DESCRIPTION OF THE DRAWINGS

The above and further advantages of the invention may be better understood by referring to the following description in conjunction with the accompanying drawings in which like reference numerals indicate identically or functionally similar elements, of which.

DETAILED DESCRIPTION OF AN ILLUSTRATIVE EMBODIMENT

Figure 1:
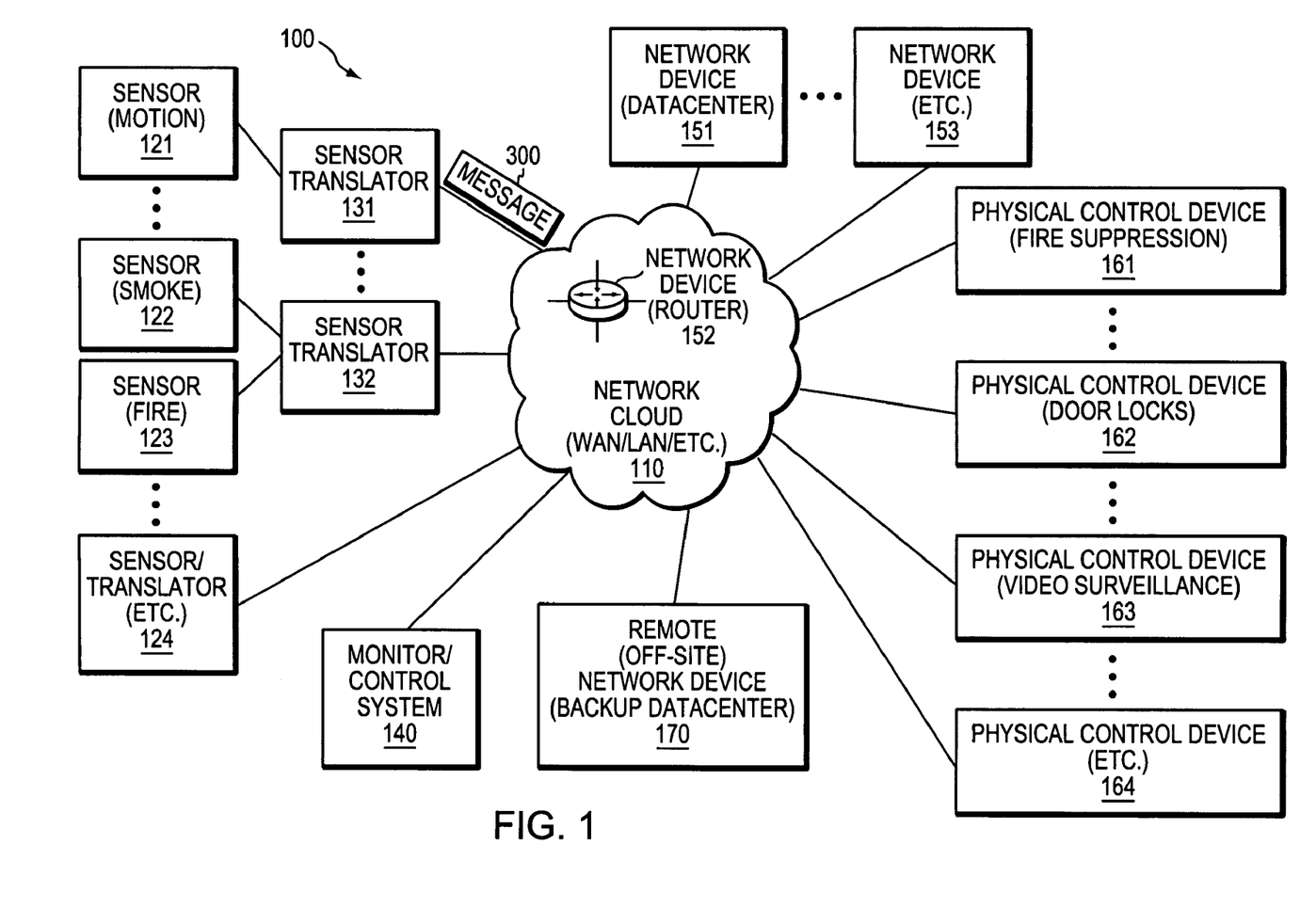
FIG. 1 is a schematic block diagram of an exemplary computer network that may be used in accordance with the present invention.

FIG. 1 is a schematic block diagram of an exemplary computer network 100 comprising a plurality of devices interconnected to a network cloud 110, such as, e.g., a wide area network (WAN), local area network (LAN), etc., as will be understood by those skilled in the art. The network 100 may be located within a single physical location, such as a building, campus, etc., or may be dispersed physically into multiple physical locations. Illustratively, the network 100 may be used within a business, a government office, a municipality, transportation authorities, a military installation, small office/home office (SOHO) networks, etc., and may be localized or dispersed physically. Also, the network may be configured as a physical network, wireless network, virtual network, combinations thereof, etc., as will also be understood by those skilled in the art.

One or more sensors, such as motion sensor 121, smoke sensor 122, fire sensor 123, or other network-attached sensors (124), may be attached to the network through one or more network-attached sensor translators 131 and 132, or may be directly attached to the network (e.g., a sensor 124 with integrated translator) themselves. The translators 131 and 132 (or sensor 124 with integrated translator) translate signals received from the sensors (e.g., raw data from the sensors) into one or more packets/frames suitable for transmission over the network, such as in the form of notification messages 300, described below. Also attached to the network may be one or more monitor/control systems 140, such as proprietary devices that are specifically designed to receive and react to sensor notifications received over the network. For example, a smoke and fire sensor may communicate notifications 300 with a centralized alarm system 140, such that the alarm system responds to a possible fire by sounding an alarm, initiating a fire suppression system, etc., as will be understood by those skilled in the art. Various network-attached physical control devices 161-164 may be attached to the network cloud 110 and may be used to control physical parameters. For example, a fire suppression device 161 may be used to initiate a sprinkler system, a door lock device 162 may be used to lock/unlock certain doors, a video surveillance system 163 may dictate the actions of one or more attached video cameras, or other network attached devices 164 may be used to control other physical parameters. Notably, physical control devices may also be configured to operate as sensors (e.g., visual recognition with video surveillance system 163, door lock position sensing with door lock device 162, etc.), as will be understood by those skilled in the art.

Various "network devices," such as one or more data centers 151, routers 152, or other conventional network devices 153 (e.g., switches, bridges, servers, personal computers, etc.) may also be connected to the network cloud 110 as will be understood by those skilled in the art. Also, one or more remote (off-site) network devices (e.g., backup data center 170) may also be connected to the network cloud 110. Specifically, as defined herein, a "network device" is any device conventionally connected within the infrastructure of a network, (e.g., data centers, routers, switches, bridges, servers, personal computers, etc.) that is used to store/transmit data and information, and that is not conventionally used to monitor and/or control physical parameters, as will be understood by those skilled in the art. Notably, the sensors, network-attached sensor translators, network-attached physical control devices, as well as the monitor/control system are configured primarily to monitor/control physical parameters, and are therefore not conventional "network devices" as used herein. These examples are merely representative. Those skilled in the art will understand that any number of devices, links, etc. may be used in the computer network 100 and connected in a variety of ways, and that the view shown herein is for simplicity.

Data packets may be exchanged among the network devices and network-attached devices (sensors, translators, monitor/control systems, physical control devices, etc.) of the computer network 100 using predefined network communication protocols such as the Transmission Control Protocol/Internet Protocol (TCP/IP), User Datagram Protocol (UDP), Asynchronous Transfer Mode (ATM) protocol, Frame Relay protocol, Internet Packet Exchange (IPX) protocol, etc.

Figure 2:
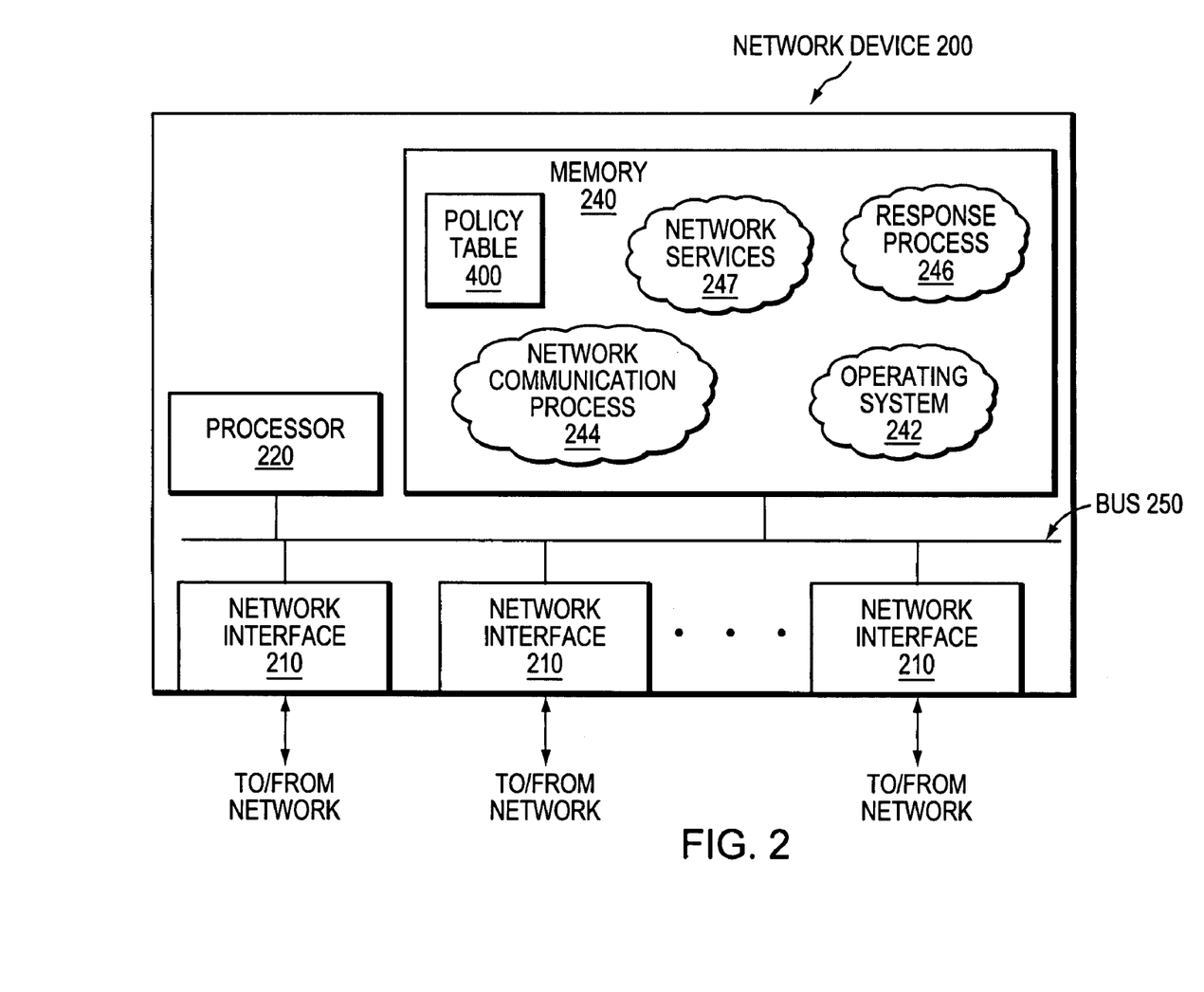
FIG. 2 is schematic block diagram of an exemplary network device that may be advantageously used with the present invention.

FIG. 2 is a schematic block diagram of an exemplary network device 200 that may be advantageously used with the present invention, e.g., as a router, data center, switch, etc. The network device comprises a plurality of network interfaces 210, a processor 220, and a memory 240 interconnected by a system bus 250. The network interfaces 210 contain the mechanical, electrical and signaling circuitry for communicating data over physical links coupled to the network 100. The network interfaces may be configured to transmit and/or receive data using a variety of different communication protocols, including, inter alia, TCP/IP, UDP, ATM, synchronous optical networks (SONET), wireless protocols, Frame Relay, Ethernet, Fiber Distributed Data Interface (FDDI), etc.

The memory 240 comprises a plurality of storage locations that are addressable by the processor 220 and the network interfaces 210 for storing software programs and data structures associated with the present invention. The processor 220 may comprise necessary elements or logic adapted to execute the software programs and manipulate the data structures, such as policy table 400. An operating system 242, portions of which are typically resident in memory 240 and executed by the processor, functionally organizes the network device by, inter alia, invoking operations in support of software processes and/or services executing on the network device. These software processes and/or services may comprise network services 247, network communication process 244, and response process 246. It will be apparent to those skilled in the art that other processor and memory means, including various computer-readable media, may be used to store and execute program instructions pertaining to the inventive technique described herein.

Network services 247 contain computer executable instructions executed by processor 220 to perform functions relating to the type of network device 200. For example, a router network device 152 may have routing services to perform functions provided by one or more routing protocols, such as IGP (e.g., OSPF and IS-IS), BGP, etc. These functions may be configured to manage a forwarding information database (not shown) containing, e.g., data used to make forwarding decisions. Other network devices, e.g., data center 151, may perform other network-related functions, such as storing data, user interfacing, etc., as will be understood by those skilled in the art. Network communication process 244 may be used by the network device 200 to communicate packets/frames of information among other devices of the network, as will also be understood by those skilled in the art.

As mentioned above, sensors (e.g., 121-124) monitor physical-based events ("non-network events"), which are generally conveyed to one or more monitoring/control systems 140. Often, the events are conveyed using proprietary system signaling messages (e.g., an internal fire alarm system); however, in accordance with the present invention, many systems transmit the events using packets/frames over the network infrastructure (e.g., the Internet). For instance, raw sensor data (e.g., analog signals, digital values, etc.) may be sent from sensors 121-123 to network-attached sensor translators 131-132. Alternatively, a sensor may also be configured to act as a network-attached sensor translator (e.g., sensor/translator 124). The translators convert (translate) the raw data into a format suitable for transmission on the network infrastructure, e.g., as packets/frames.

Figure 3:
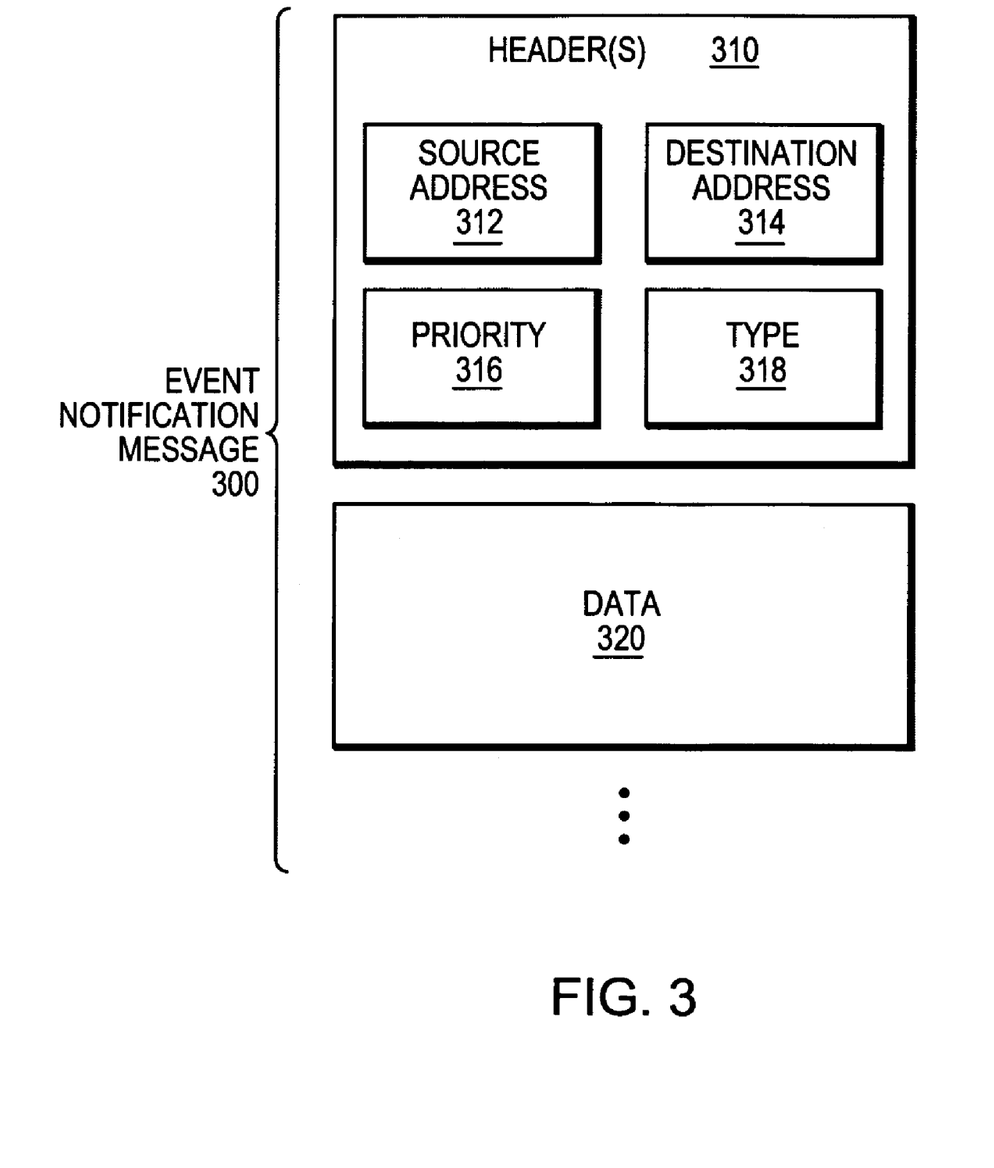
FIG. 3 is a schematic block diagram of an exemplary event notification message that may be advantageously used with the present invention.

FIG. 3 is a schematic block diagram of an exemplary event notification message 300 that may be advantageously used with the present invention. Illustratively, the notification message is embodied as a TCP/IP data packet, but those skilled in the art will understand that other suitable network transmission formats (e.g., ATM frames, etc.) may be used in accordance with the present invention. The message 300 includes one or more headers 310 (e.g., IP/ATM headers, etc.), and a data field 320. Source address 312 and destination address 314 within the header 310 are the network addresses for the sending device (e.g., sensor translators) and the receiving device (e.g., a monitor/control system 140), respectively. Priority field 316 (optional) contains a value representative of a priority level of the message 300, and Type field 318 (optional) contains a specific type value indicating the type of message. The contents of both fields will be understood by those skilled in the art, and are described in accordance with the present invention below. The data content of the data field 320 of the event notification message is generally a proprietary matter, since the sending device sends the data to a monitoring/control system 140 (or, notably, other network devices) configured to interpret the specific data accordingly.

The present invention is directed to a technique for dynamically responding to non-network events at a network device in a computer network. According to the novel technique, one or more sensors automatically detect (sense) one or more non-network events, and notifications of the non-network events are then transmitted over the network. One or more network devices (e.g., data centers, servers, routers, switches, bridges, computers, personal computers, IP phones, etc.) detect the notifications of the network events, and dynamically respond to the non-network events based on one or more associated policies. For example, one or more network-based policies may be defined that modify one or more network configuration parameters in response to the non-network events. Alternatively or in addition, one or more physical-based policies may be defined that instruct one or more network-attached physical control devices to modify one or more physical parameters.

In accordance with one aspect of the present invention, the sensors (e.g., 121-124) are any network-attached devices that sense non-network events, e.g., physical events, that may or may not directly or indirectly affect the network. For instance, fires, floods, unauthorized physical access (e.g., to a server room), chemical exposure, radiation, explosions, earthquakes, production control system problems, etc., may each affect the network in some way. That is, these physical events may result in physical changes to the environment that may directly affect the network by changing the network topology (e.g., by destroying/changing network links, components, devices, etc.). Also, the network may indirectly be affected by physical events in many ways, such as by creating a greater volume of traffic (call volume in response to an emergency), etc. Further, sensors 121-124 may also be used to detect non-network (physical) events that do not affect the network, such as Radio Frequency Identification (RFID) presence, toxic chemical detection, etc. Those skilled in the art will understand that those non-network events mentioned herein are merely examples and are in no way limiting to the scope of the present invention. In sum, any physical event (non-network event) that may be sensed by a sensor attached to the network (e.g., via a translator) may be used in accordance with the present invention.

As noted, the sensors 121-124, or notably network-attached sensor translators 131-132 (e.g., and 124), transmit the notification 300 of the non-network event (e.g., as data packets/frames) on the network to one or more destination devices, such as a monitoring system and/or control center 140. Generally, the monitoring/control system 140 is configured to react to the non-network event in a conventional manner, such as, e.g., sounding alarms, notifying authorities, etc., as will be understood by those skilled in the art. According to the present invention, a traditional network device (e.g., server, router, etc.) that is not conventionally configured to react to non-network events, may now be configured to receive and/or intercept and interpret the notification messages 300 (e.g., as an interested intermediate device).

The network device may be a destination device of the notification message 300 (i.e., in destination address field 314), in that the sensors/translators may be configured to send the non-network event notification messages to interested intermediate devices in accordance with the present invention. For example, notification of a fire within a building may be sent conventionally to monitoring/control station 140, and additionally (or alternatively) to an "interested" data center 151 in accordance with the present invention. The network devices and/or sensors/translators may be manually configured to communicate directly with each other (unidirectional or bidirectional), or may be configured to dynamically discover each other, as will be understood by those skilled in the art (e.g., auto-discovery). Otherwise, i.e., where the network device is not the intended recipient, the network device may receive the notification message 300 during its transmission to the destination device due to a number of reasons as will be understood by those skilled in the art (e.g., broadcast networks, intermediate nodes, etc.). For instance, the network device may monitor the packets/frames transmitted over the network for certain packet/frame types or formats (e.g., in type field 318), certain transmission protocols, etc., to determine that an event notification message 300 has been sent. As either the destination device or an intercepting device, each network device may be configured to understand the content and/or meaning (e.g., from data field 320) of the event notification message 300. In other words, in accordance with the present invention, network devices may be configured to understand non-network events, e.g., fires, etc.

Alternatively or in addition, the network devices may be configured to understand when non-network events may be occurring without understanding the content of the message. For instance, a network device may determine that traffic generation behavioral patterns have changed in such a way as to indicate a possible event. Assume, for example, that a source address (312) matching a fire sensor suddenly begins sending many event notifications. The network device may be configured to determine (e.g., based on thresholds, etc.) that a fire (i.e., corresponding to the fire sensor's source address) may be occurring.

Notably, the non-network event need not be located at the same physical location as the network device, but in a location that may affect the network device in some way (e.g., within the same building, campus, etc.). Those skilled in the art will understand that physical location does not limit the reception/interception of a non-network event notification message 300, such as, e.g., where the destination device of the notification is a remote network device (e.g., data center 170).

Figure 4:
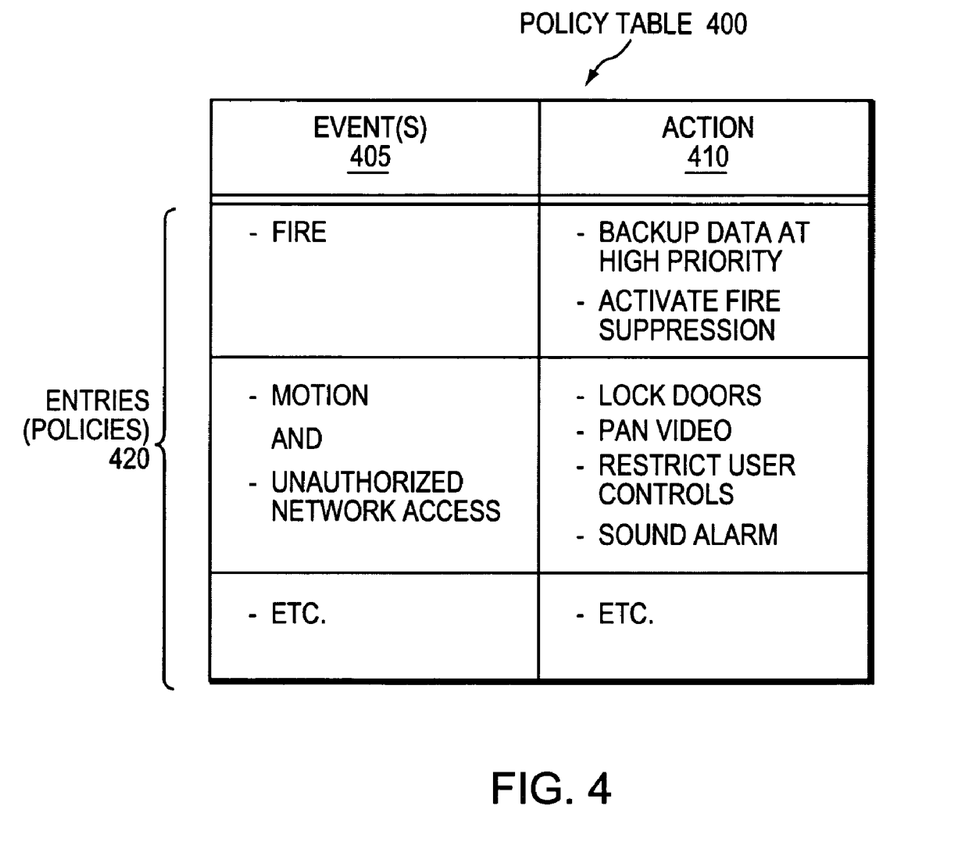
FIG. 4 is a schematic block diagram of an exemplary policy table that may be advantageously used with the present invention.

In accordance with another aspect of the present invention, the receiving/intercepting network device applies one or more pre-configured policies to the notification in order to determine what response, if any, is appropriate. The policies may define various responses relating to network parameters or to physical parameters, each of which is under the control of network-attached devices. FIG. 4 is a schematic block diagram of an exemplary policy table 400 that may be advantageously used with the present invention. Policy table 400 is illustratively stored in memory 240 and includes one or more entries 420, each representing a policy comprising a plurality of fields for storing an event 405, and a response (action) 410. The policy table 400 is illustratively maintained and managed by response process 246. To that end, the response process 246 maintains a list of such policies 420, including possible events and their configured actions (e.g., preconfigured on the device or created by a system administrator). The events 405 may be any network-detectable event selected from network-based events, non-network (physical) based events, or combinations thereof. Actions 410 may be any network-controllable actions selected from network actions, non-network (physical) actions, or combinations thereof.

Figure 5A:
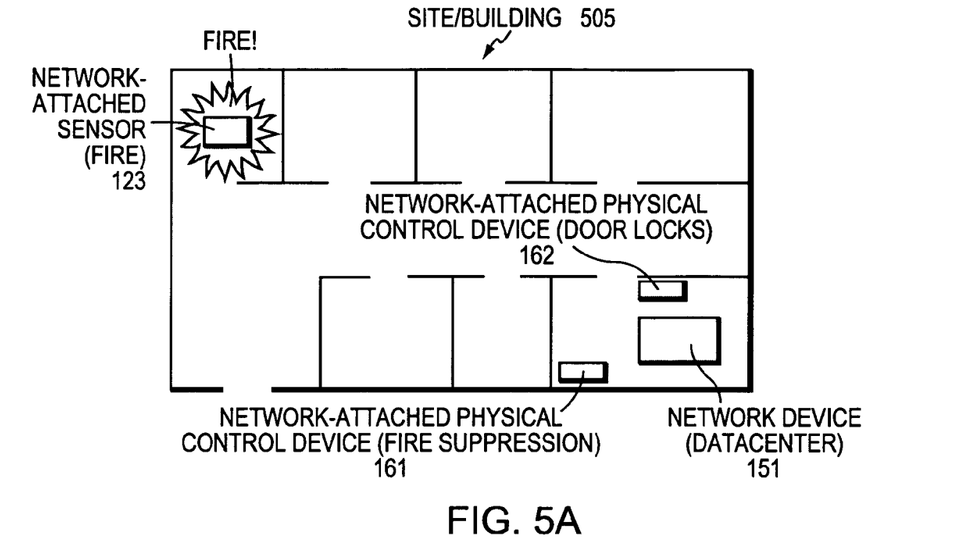
FIG. 5A shows a schematic floor plan diagram of a site/building that may advantageously utilize the present invention.

For instance, a non-network event (e.g., a fire within a building of the network device) may indicate to the particular network device (e.g., a data storage device 151 intercepting the notification destined for a fire monitoring system 140) that certain network actions should be performed in response (e.g., to protect the network device's operations and/or people in the area). For example, FIG. 5A shows a schematic floor plan diagram of a site/building 505 that may advantageously utilize the present invention. Upon detecting a fire at a network-attached fire sensor 123 and learning of the event notification 300 as described above, the network device (data center) 151 may begin transferring the data to an off-site storage location 170, and may do so at a high priority according to the corresponding policy 420 of the policy table 400. Also, the network device 151 may be configured to handle incoming requests differently due to the detected non-network event. For example, the data center 151 may redirect client requests to store data to one or more other remote storage devices 170, or to reply with errors messages, e.g., "this service is currently unavailable," etc.

Further, the network device 151 may notify a network-attached physical control device to control one or more physical parameters, for example, to protect the network device itself (as well as people), such as, e.g., initiating a fire suppression system 161 at the network device (e.g., sprinklers, Halon, etc.), preferably prior to a fire being detected at the network device (i.e., preemptively). In this way, the network device may be protected before the fire reaches that portion of the building 505 by backing up the data before it is too late. Without the dynamic response, a system administrator would be required to notice the conventional fire alarms, and instruct the network device to perform certain actions (e.g., backup data). In the event the network device 151 is not remotely accessible, this could place the administrator in physical danger. The present invention, therefore, not only protects data, but network/system administrators.

In particular, various policies may be configured such that people are informed and/or protected as well. For example, in the event of an emergency situation (e.g., fire), locally-attached network devices may be directed to display warning messages to other user interface network devices (153), such as, e.g., laptop computers, personal desktop assistants (PDAs), cell phones, etc. For instance, a centralized router 152 may contain one or more databases indicating which network devices are in communication within the network 100 of a particular site (e.g., a building). Accordingly, the router 152 may determine, e.g., that a fire has been detected within the building, and may respond by instructing one or more user interface network devices 153 in communication with the router to display a message to "exit the building," or that "the alarm is only a drill." Also, by using RFID sensors within the building, network devices may determine personnel locations, and may direct people toward or away from triggering events (e.g., by granting/denying access to doors, lighting directional arrows on exit signs, etc.).

It is important to note, however, that while the above description describes a dynamic (e.g., fully automated) policy response to an event, one aspect of the present invention is to include some measure of controlled interaction to the responses. In other words, a degree of manual intervention may be configured in order to confirm the action to be taken according to policy. For instance, prior to directing a network-attached physical control device 164 to perform a specific action (e.g., initiate sprinkler systems), the policy may be configured to first confirm the decision with a security personnel (i.e., requiring a user input/check point). Once the action is confirmed by a security personnel (or system administrator, etc.), the action may be performed. Otherwise, as those skilled in the art will understand, an automated response may be improper due to undetectable sensing errors (e.g., a faulty smoke detector). Also, the manual confirmation may be made by any user with acceptable confirmation authority. For instance, as mentioned above, a network device (e.g., router 152) may be aware of the user interface devices 153 located near the area of the event. The network device, then, may detect a non-network event, e.g., smoke, and also may determine that one or more user interface devices are located within the same area as the event (e.g., cell phones, IP phones, etc.). According to the present invention, the network device may send a message to one or more of the user interface devices 153 requesting a confirmation response (e.g., a key or button, e.g., pressing "Y") that the event has actually occurred. In response to a confirmation (e.g., the first confirmation received), the network device may then continue to perform the action defined within the policy.

Figure 5B:
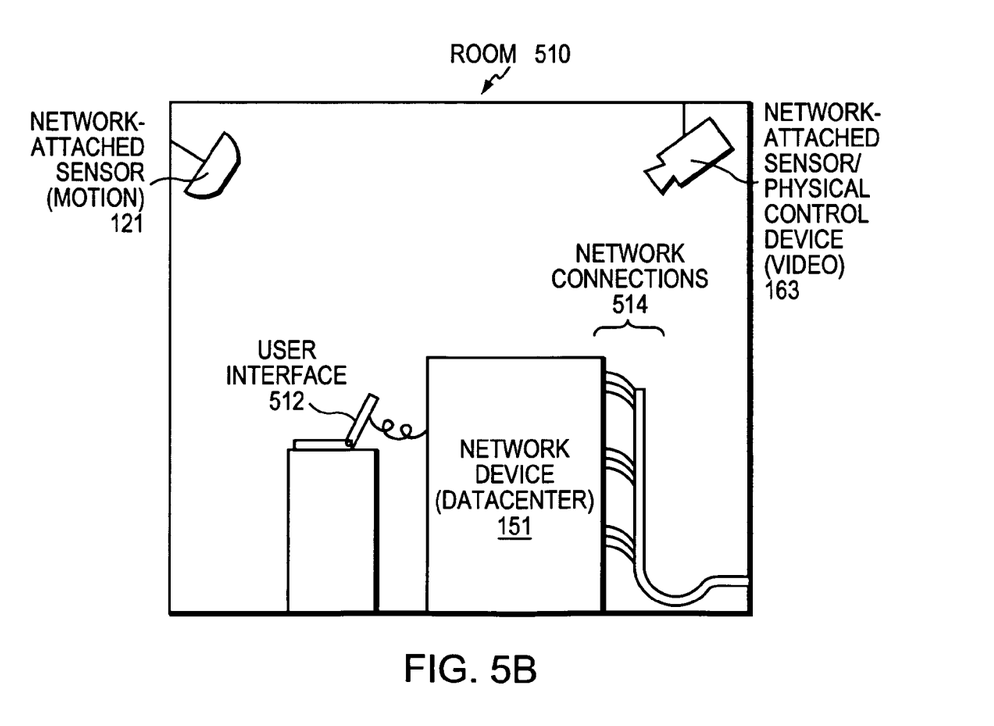
FIG. 5B shows a schematic diagram of a room that may advantageously utilize the present invention.

As another example, FIG. 5B shows a schematic diagram of a room 510 (e.g., within site/building 505 of FIG. 5A) that may advantageously utilize the present invention. Illustratively, according to policy table 400, a network device (data center) 151 may be configured to detect an event notification from a network-attached motion sensor 121, e.g., directly addressed (destination address 314) to the data center 151. In the event (405) that motion is detected as well as unauthorized network access to user interface 512 (i.e., indicating a human presence within the room 510), the data center 151 may be configured, based on policy, to lock the doors to the room (e.g., network-attached door locks 162 of FIG. 5A), pan the network-attached video surveillance device 163 toward the user interface 512, restrict user access controls, sound an alarm, etc. Further, in the event the unauthorized access is detected as a physical reconfiguration of network connections 514, the data center 151 may direct the video surveillance device 163 to pan toward the connections 514 instead.

According to the present invention, the policies may operate in a "feedback" and/or "tiered" manner. For instance, a feedback policy may require that once an action is taken in response to a first event, the network device may monitor for subsequent events to determine whether the action was successful. For example, a first event may be a detected fire within one portion of a building, as described above in FIG. 5A. Assume now that a first action/response to a detected fire in one room of the building 505 is a feedback policy may be to initiate a fire suppression system. If after a configurable time, another fire sensor is detects fire in a different room of the building, the network device may determine that the fire suppression was unsuccessful, and may then close doors to a data center room, and begin the backup of data to a remote site.

Also, a tiered policy may exist, for example, where one policy (e.g., of a first network device) affects another policy (e.g., of a second network device). Tiered policies may be configured on different network devices within the network. For instance, a first event may cause a first response from the first network device. The first network device, then, may perform an action that has an affect on the network (e.g., transmit a message, a command, etc.). This action may in turn be sensed/detected by the second network device, which in response performs another action, etc. As an example, a physical security breach may be detected by a control/monitor system, and relayed to a security station. Personnel at the security station may respond by (or confirm the response of) initiating one or more security alarms. Another network device, e.g., a data center 151, may detect the security alarms (e.g., which may be intercepted, or explicitly sent to the data center by the security system), and may be configured to begin creating a backup copy of the data at a remote location in response. A third network device, e.g., router 152, may detect the sudden backup traffic from the data center 151, and may, in turn, adjust network parameters to grant the backup traffic higher priority than other traffic.

These events and actions, both network and non-network, are merely representative examples. Those skilled in the art will appreciate that any network-detectable event and any network-controllable actions may be advantageously used in accordance with the present invention on network devices not conventionally configured to detect/react to such events or to control such actions. For instance, in addition to those mentioned above, the present invention may also be configured to, for illustrative examples, control network actions such as, inter alia: stop sending network data into a burning building; grant high priority to all communications from an area stricken by an earthquake; redirect network traffic (e.g., to a non-threatened remote system, away from trouble, around trouble, to an emergency center, etc.); secure/encrypt traffic transmission; re-classify traffic; change quality of service (QoS); change priority (e.g., all traffic from an emergency area to high priority, all traffic to/from an emergency center to the highest priority, voice to high priority and web browsing to low priority, etc.), etc. The present invention may further be configured to, for illustrative examples, control non-network (physical) actions such as, inter alia: send/sound alarms; direct video cameras (tilt, zoom, pan); lock/unlock doors; initiate/cease operation of lights, air handlers, fire suppression (sprinklers, Halon systems), HVAC, etc.; redirect physical security surveillance; control network connected robots; control electromechanical devices, etc. In other words, any network event, non-network event, network parameter, non-network parameter, responses, actions, reactions, etc., that may be used in accordance with the present invention may be covered by the scope of protection of the present invention.

Specifically, the present invention is direction to systems and methods that sense non-network events at a network device (e.g., as a recipient or interceptor), and respond by enforcing one or more network- and/or non-network-based policy actions. In particular, by allowing the network devices to detect and respond to non-network events, the network device may have the opportunity to respond locally prior to the transmission of a message 300 to and from a control/monitoring station 140 (assuming, that is, that control/monitoring station is utilized). The network device (153), therefore, may be a "first responder" to the non-network events, perhaps operating within a critical time period of response, rather than awaiting a command from a control/monitoring station. This applies to both self-preserving actions of the network (e.g., physical and/or network protection of the network devices and/or data), as well as any other configurable actions (e.g., notifications to personnel, handling of process requests, etc.), as will be appreciated by those skilled in the art.

Figure 6:
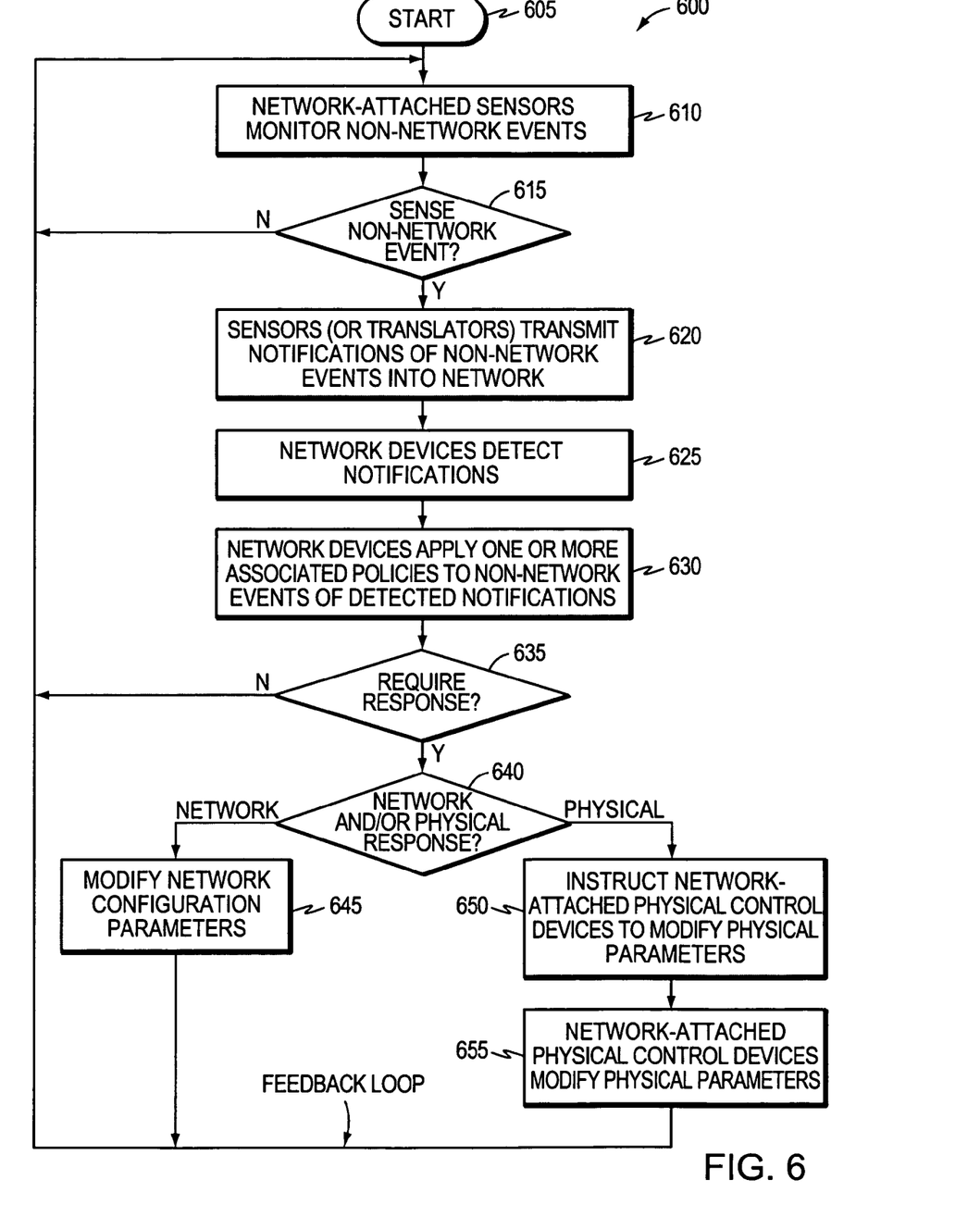
FIG. 6 is a flowchart illustrating a procedure for dynamically responding to non-network events at a network device in a computer network in accordance with the present invention.

FIG. 6 is a flowchart illustrating a procedure for dynamically responding to non-network events at a network device in a computer network in accordance with the present invention. The procedure 600 starts at step 605, and continues to step 610, where one or more network-attached sensors (e.g., sensors 121-124) monitor non-network events, such as, e.g., fire, flood, motion, etc., as described above. The sensors continue to monitor in step 610 until they sense a non-network event in step 615. As mentioned above, sensing an event may be in response to surpassing various thresholds, or alternatively may be a continual update of current conditions (e.g., temperature, etc.). Once a non-network event is sensed in step 615 (e.g., a fire), the sensors or network-attached sensor translators (e.g., translators 131 and 132) transmit notifications of the non-network event (e.g., notification message 30) into the network in step 620. For instance, the sensors (or translators) may direct the notification messages to a monitoring/control station (140), or directly to network devices configured to receive such notifications (e.g., data center 151).

At step 625, a network device (e.g., data center 151) detects the notification message 300, such as by directly receiving the message (i.e., as the destination), or by intercepting the message (e.g., detecting a notification message transmitted through the network device) as described above. Upon detecting the notification, the network device applies one or more policies (e.g., from policy table 400) to the non-network event of the notification in step 630. For example, data center 151 may perform a lookup operation into its policy table 400 to determine what response, if any, needs to be taken in the event of a fire within its building. If no response is required in step 635 (e.g., a motion detection in a location non-threatening to the data center), the procedure 600 returns to step 610 where the sensors monitor for any non-network events.

If a response is required in step 635 based on the applied policy, the network device may be configured to perform one or more network-based and/or physical-based responses in step 640. If a network-based response is warranted, the network device modifies network configuration parameters in step 645 accordingly. For example, the data center 151 may dynamically respond to a fire in the building by storing its data at an offsite storage facility (e.g., remote data center 170), possibly at a higher priority than conventional traffic from the data center 151. Alternatively, or in addition, a physical-based response may be warranted at step 640, in which case the network device instructs one or more network-attached physical control devices to modify one or more physical parameters in step 650 accordingly. For example, the data center may also respond to a fire in the building by i) requesting the preemptive activation of a fire suppression system in the data center's location, ii) sending an alarm to an administrator of the data center, iii) locking/unlocking doors to the data center's location (e.g., for granting/denying access to the data center), iv) etc. At step 655, the network-attached physical control devices (e.g., fire suppression system 161, alarm system 164, locking system 162, etc.) respond by modifying their respective physical parameters. Upon dynamically responding to the non-network event, the procedure 600 may return to step 610 to monitor for events. Notably, this may create a feedback loop for the physical-based responses, as described above, in which the network device may determine whether the physical responses were effective. For instance, the network device may maintain a state of response, such that if additional notifications are received (e.g., spreading fire, power outages, etc.), the network device may respond accordingly.

Advantageously, the novel technique dynamically responds to non-network events at a network device in a computer network. By reacting to non-network events at a network device, the novel technique increases responsiveness to the non-network events, which may result in better operation and/or protection of the network, e.g., for the infrastructure as well as data stored in and/or transmitted over the network, and better protection of people near the non-network events. Also, by dynamically responding, the novel technique increases human personnel safety who would otherwise be required to manually respond in the presence of danger, and further alleviates dependency upon human response (e.g., that must be both proper and timely).

The foregoing description has been directed to specific embodiments of this invention. It will be apparent, however, that other variations and modifications may be made to the described embodiments, with the attainment of some or all of their advantages. For instance, it is expressly contemplated that the teachings of this invention can be implemented as software, including a computer-readable medium having program instructions executing on a computer, hardware, firmware, or a combination thereof. Also, electromagnetic signals may be generated to carry computer executable instructions that implement aspects of the present invention over, e.g., a wireless data link or a data network, such as the Internet. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method for dynamically responding to non-network events, the method comprising:
    storing, at a network device, a plurality of pre-configured policies, where the network device is a router, a switch or a bridge configured to operate within a computer network, and each pre-configured policy specifies one or more actions to be taken in response to a corresponding non-network event;
    detecting a notification of at least one non-network event at the network device; and
    dynamically responding to the non-network event at the network device by:
        identifying the pre-configured policy that matches the non-network event that was detected, and
        performing the one or more actions specified by the identified pre-configured policy, where the one or more actions include modifying at least one network configuration parameter of the computer network to reclassify network traffic received at the network device, change a Quality of Service (QoS) of the network traffic received at the network device, or change a priority of the network traffic received at the network device.

2. The method as in claim 1, the method further comprising:
    instructing a network-attached physical control device to modify at least one physical parameter in response to the non-network event.

3. The method as in claim 2, further comprising:
    modifying the physical parameter at the network-attached physical control device.

4. The method as in claim 1, further comprising:
    sensing the non-network event at a sensor; and
    transmitting the notification of the non-network event into the computer network.

5. The method as in claim 4, further comprising:
    informing, from the sensor, a network-attached sensor translator of the non-network event, wherein the network-attached sensor translator transmits the notification of the non-network event into the computer network.

6. The method as in claim 1, wherein the associated policy defines at least one response to an occurrence of at least two particular non-network events.

7. The method as in claim 1, further comprising:
    detecting at least one network event at the network device, wherein the associated policy defines at least one response to an occurrence of both at least one particular network event and at least one particular non-network event.

8. A system for dynamically responding to non-network events, the system comprising:
    at least one network device storing a plurality of pre-configured policies, where each pre-configured policy specifies one or more actions to be taken in response to a corresponding non-network event, the at least one network device being a router, a bridge or a switch for operation in a computer network and configured to detect a notification of at least one non-network event, identify the pre-configured policy that matches the non-network event that was detected, and
    perform the one or more actions specified by the identified pre-configured policy, where the one or more actions include modifying at least one network configuration parameter of the computer network so as to reclassify network traffic received at the at least one network device, change a Quality of Service (QoS) of the network traffic received at the at least one network device, or change a priority of the network traffic received at the at least one network device.

9. The system as in claim 8, further comprising:
    at least one network-attached physical control device configured to modify at least one physical parameter; and
    wherein the at least one network device is further configured to instruct the network-attached physical control device to modify at least one physical parameter in response to the non-network event.

10. The system as in claim 8, further comprising:
    at least one sensor configured to sense the non-network event; and
    at least one network-attached sensor translator configured to transmit the notification of the non-network event into the network.

11. The system as in claim 10, wherein the sensor and the network-attached sensor translator are co-located on a same device.

12. A network device for use with dynamically responding to non-network events in a computer network, the network device comprising:
    a plurality of network interfaces where at least one network interface is configured to receive non-network event notifications, and two or more network interfaces are configured to receive data traffic;
    a processor coupled to the plurality of interfaces and to the network interface and adapted to execute software processes including at least one data traffic forwarding process; and
    a memory adapted to store a response process executable by the processor, the response process configured to:

i) detect a notification of a non-network event received on the at least one network interface; and ii) dynamically respond to the non-network event based on at least one associated policy, where the response includes modifying one or more of a classification, a Quality of Service (QoS) or a priority associated with at least a portion of the received data traffic.

13. The network device as in claim 12, wherein the response process is further configured to:

modify at least one additional network configuration parameter in response to the non-network event.

14. The network device as in claim 12, wherein the response process is further configured to:

instruct at least one network-attached physical control device to modify at least one physical parameter in response to the non-network event.

15. The network device as in claim 12, wherein the associated policy defines at least one response to an occurrence of at least two particular non-network events.

16. The network device as in claim 12, wherein the response process is further configured to:

detect at least one network event, wherein the associated policy defines at least one response to an occurrence of both at least one particular network event and at least one particular non-network event.

17. A non-transitory computer readable medium containing executable program instructions for dynamically responding to non-network events, the computer readable medium adapted to operate on a network device, the executable program instructions comprising program instructions adapted to:

store at the network device a plurality of pre-configured policies, where each pre-configured policy specifies one or more actions to be taken in response to a corresponding non-network event;

detect a notification of a non-network event; and dynamically respond to the non-network event by:
identifying the pre-configured policy that matches the non-network event that was detected, and
performing the one or more actions specified by the identified pre-configured policy, where the one or more actions includes modifying at least one network configuration parameter of the computer network that controls a classification of network traffic received at the network device, a Quality of Service (QoS) of the network traffic received at the network device, or a priority of the network traffic received at the network device, wherein the network device is a router, a bridge or a switch.

18. A method comprising:

monitoring for a non-network event by a network-attached sensor;

transmitting a notification of occurrence of the non-network event to a router configured to forward data packets in a computer network;

storing at a memory at the router at least one policy associated with the non-network event;

detecting the notification at the router;

applying, by the router, the at least one policy to the non-network event associated with the detected notification; and modifying at least one network configuration parameter of the computer network, by the router, in response to application of the policy to the non-network event, the modification of the at least one network configuration parameter to change a classification, a Quality of Service (QoS) or a priority associated with one or more data packets received at the router, so as to alter the manner in which the one or more data packets received at the router are forwarded by the router within the computer network.

19. The method as in claim 18 further comprising:

instructing, by the router, a network-attached physical control device to modify at least one physical parameter in response to application of the policy to the non-network event.

20. The method as in claim 19, further comprising:

modifying the physical parameter at the network-attached physical control device.

* * * * *

UNITED STATES PATENT AND TRADEMARK OFFICE
CERTIFICATE OF CORRECTION

PATENT NO. : 8,185,618 B2  
APPLICATION NO. : 11/447634  
DATED : May 22, 2012  
INVENTOR(S) : Robert P. Beliles, Jr. et al.

Page 1 of 1

It is certified that error appears in the above-identified patent and that said Letters Patent is hereby corrected as shown below:

Col. 4, line 25 should read: "the network device ~~is~~ (i.e., preemptively)."

Signed and Sealed this
Twenty-fourth Day of July, 2012

David J. Kappos
*Director of the United States Patent and Trademark Office*